May 24, 1966 T. A. OSIAL ET AL 3,253,166

ELECTROMECHANICAL FREQUENCY DISCRIMINATOR

Filed Jan. 28, 1963

United States Patent Office 3,253,166

Patented May 24, 1966

3,253,166

ELECTROMECHANICAL FREQUENCY DISCRIMINATOR

Thaddeus A. Osial and John H. Thompson, Penn Hills, Pa., assignors to Westinghouse Electric Corporation, Pittsburgh, Pa., a corporation of Pennsylvania Filed Jan. 28, 1963, Ser. No. 254,232
4 Claims. (Cl. 310—8.2)

The present invention relates to frequency discriminators, and more particularly to frequency discriminators utilizing a mechanical resonator.

Frequency discriminators having lumped parameters functioning as frequency modulation discriminators in automatic frequency control systems and other apparatus are well known in the art. Schemes using quartz crystals to accomplish the same result have been devised for systems requiring a sharp S-curve discriminator characteristic. These systems utilize the high effective inductance and high Q characteristics of the quartz crystal. Since in quartz crystal discriminators the maximum signal output and, the null output at the intermediate frequency, occur at frequencies that are very near to each other giving a sharp S-curve characteristic, only small frequency deviations of the incoming frequency modulated signal may be employed. Other piezoelectric materials such as barium titanate or lead zirconium titanate have a greater frequency separation between maximum and null outputs so that greater frequency deviations may be employed by using these materials. However, the Q's of these materials are much lower than that for quartz, thus resulting in reduced sensitivity. Also it has been found that the characteristics of these materials change with age. Moreover, all of the above materials possess a frequency separation which cannot be altered appreciably or readily.

It is, therefore, an object of the present invention to provide a new and improved electromechanical frequency discriminator.

It is a further object of the present invention to provide a new and improved electromechanical frequency discriminator having a high Q, a controllable frequency separation and an alterable intermediate frequency.

Broadly, the present invention provides an electromechanical frequency discriminator, in which, a vibrator resonant in a flexural mode with nodal diameters is activated by incoming signals. Output signals proportional in amplitude to predetermined frequencies of the input signals are taken from predetermined areas of the vibrator and compared to provide discriminator output signals.

These and other objects of the present invention will become more apparent when considered in view of the following specification and drawings in which.

Figure 1:
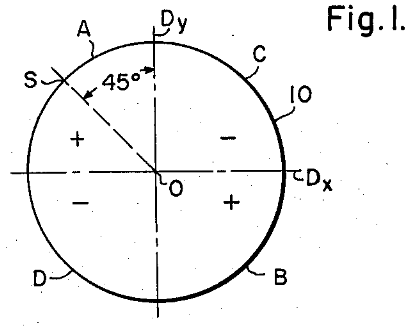
FIGURE 1 is a diagrammatic view of an unperturbed resonator used to aid in the explanation of the present invention.

A symmetrical metallic disc is disclosed in copending application Serial No. 170,157, filed January 31, 1962, now Patent No. 3,194,207 by A. Nelkin, R. A. Lester, R. H. Whittaker and J. H. Thompson and assigned to the same assignee as the present application, that can be readily excited to vibrate in a flexural mode having two nodal diameters by striking the disc radially. In FIG. 1, for example, if the disc 10 is excited by striking it along its circumference at point S in a direction toward the center O of the disc 10, the nodal diameters will coincide with coordinates axes $D_x$ and $D_y$, for the case when the radius OS is 45° away from the coordinate axes on an antinodal diameter. The flexural mode of vibration is such that opposite quadrants of the disc are in phase. As is shown in FIG. 1, the quadrants A and B are in phase, with the plus (+) sign indicating that the quadrants A and B will be moving toward the viewer at the instant in time viewed. The quadrants C and D will be in phase and opposite to the phase of sectors B and D, with the minus (−) sign indicating that the quadrants C and D are moving away from the viewer at the point in time viewed. This type of vibration is characteristic of a resonator which is suspended in free air and contacting no other external structure. Ordinarily, when a disc is mounted to produce such a vibration, a great amount of vibratory energy is absorbed in the mounting structure greatly attenuating the magnitude ultrasonic vibration transmitted to the air.

Figure 2:
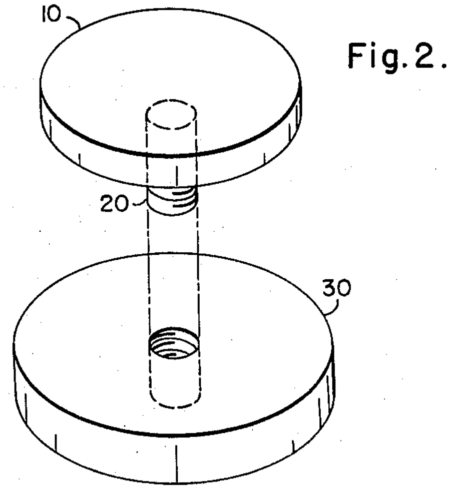
FIG. 2 is an isometric diagram of an unperturbed resonator showing the mounting structure.

FIG. 2 shows a vibrator disc 10 which may operate in the flexural mode having a mounting structure in which a pin 20 is connected at the center of the bottom surface of the vibrator so that equal and opposite vibratory forces are applied to this pin. The disc 10 is shown having the mounting pin 20 having one end integrally connected to the disc 10 and being concentric to the axis of the disc 10. The disc 10 and the pin 20 should comprise one integral piece being formed from one piece of material. A base plate 30 is also provided into which the other end of the mounting pin 20 is threaded. By so mounting the resonator 10, the mounting pin 20 is integral with the vibrator disc providing an undamped connection between the vibrating disc and the mounting pin. With the mounting pin 20 being located in the center of one of the circular surfaces of the vibrator disc 10 and being integrally connected to the disc, the vibratory forces projected onto the pin are equal and opposite and cancel each other. As such, the free end of the mounting pin 20 can be terminated by any conventional connection without losses of energy through the mounting means, such as, to the base member 30. Since energy imparted to the disc 10 is retained in the disc due to the cancellation afforded by the concentric mounting and the undamped connection with the resonator, a considerable amount of ultrasonic energy may be generated and transmitted by the vibrator 10.

In the resonator of FIGS. 1 and 2, if the striking diameter is rotated by an angle $\Delta\theta$ relative to the fixed coordinate axis then the nodal planes will also be rotated by the angle $\Delta\theta$ while the frequency of vibration will remain unchanged. The frequency of vibration $f_0$, will, of course, be determined by the physical parameters of the particular resonator disc used. The system then can be considered as having an infinite spacial mode degeneracy relative to the fixed coordinate axes.

In application Serial No. 190,118, filed April 25, 1962 by R. H. Whittaker and J. H. Thompson and assigned to the same assignee as the present application it is shown that the infinite spacial degeneracy can be removed from the resonator by perturbing the symmetry of the system. One manner in which this can be accomplished is by drilling a radially directed cylindrical hole in the disc. It has been found that the disc then can be excited to vibrate at either of two frequencies or simultaneously at two frequencies, with each of the frequencies differing from the frequency $f_0$ of the unperturbed disc. By varying the depth of the perturbing hole, the frequency separation can be changed. Also, it should be noted that similar operation can be obtained by drilling four radial holes into the disc with the holes being spaced 90° apart. Various structures and modes of operation for such a perturbed resonator capable of operating at two frequencies is disclosed in copending application Serial No. 190,118, supra.

Figure 3:
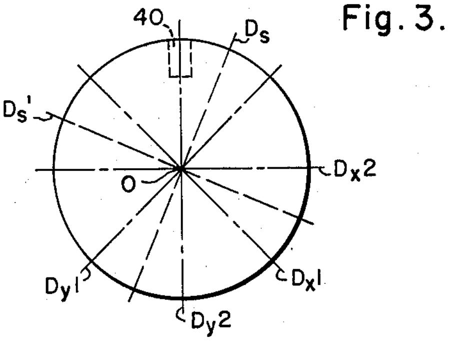
FIG. 3 is a diagrammatic view showing a perturbed resonator.

Referring to FIG. 3, a perturbed disc is shown. The structure of the perturbed disc is substantially the same as that of the unperturbed disc of FIGS. 1 and 2, except that the hole 40 is drilled radially into the side surface of the disc along the diameter $D_y2$. If the disc is excited, by striking the disc radially, for example, along the diameter $D_x1$ or $D_y1$, the disc will vibrate at a frequency $f_1$, which can be detected along the diameters $D_x1$ and $D_y1$. On the other hand, if the disc is excited along the diameter $D_x2$ or $D_y2$, the disc will vibrate at a frequency $f_2$ which then can be detected along the diameters $D_x2$ and $D_y2$. If, however, the disc is excited along some intermediate diameter such as the diameter $D_s$ or $D_s'$, the disc will vibrate such that both frequencies $f_1$ and $f_2$ will exist simultaneously so that they can be detected independently along the diameters $D_x1$, $D_y1$ and $D_x2$, $D_y2$, respectively.

It has been determined:

$$f_1 < f_0$$
$$f_2 > f_0$$

where $f_0$ is the frequency of the unperturbed disc. See the Whittaker and Thompson application, Serial No. 190,118, supra.

For example, a resonator disc having an outside diameter of 1½ inches, a thickness of ½ inch, and one radial hole of ⅛ inch diameter and ¼ inch deep, would have a frequency $f_1$ of 33,219 cycles per second and a frequency $f_2$ of 33,525 cycles per second. Unperturbed frequency $f_0$ would be 33,362 cycles per second, the frequency difference being 306 cycles per second.

Figure 4:
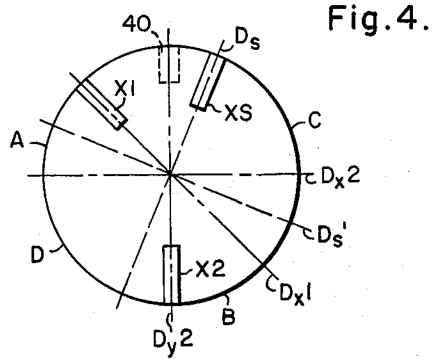
FIG. 4 is a schematic diagram of a resonator as utilized in the present invention.

FIG. 4 shows a perturbed disc having the activating element XS and the sensing elements X1 and X2 mounted on the top surface of the disc 10. The activating and sensing elements should have electrostrictive properties and may comprise piezoelectric materials such as barium titanate or lead zirconium titanate. Such electrostrictive materials have the characteristic that when an electric field is impressed across the material, the material will provide mechanical forces in predetermined directions. Also, electrostatic or inductive activating and sensing element could be used. Conversely, if a mechanical force is applied to the material, an electric potential will be generated across suitably disposed terminals on the element. Thus, as shown in FIG. 4, if an electrostrictive activating element XS is fixedly mounted on the top surface of the disc and an alternating electric potential is applied thereto, the element will expand and contract thus flexing the disc. The disc will have imparted thereto a radially directed vibratory force which will cause the disc to be activated into vibration. So, if a suitable electrical input signal is applied to the electrostrictive element XS in the form of a frequency modulated signal varying about the resonant frequency $f_0$ and having as its maximum and minimum deviation frequencies $f_2$ and $f_1$, respectively, the disc will be activated into vibrations at the respective frequencies $f_1$ and $f_2$ along predetermined diameters.

The frequency $f_1$ may be detected along the $D_x1$ axis which is an antinodal diameter where maximum amplitude or vibrations of frequency $f_1$ may be detected. As is shown in FIG. 4, the electrostrictive sensing element X1 is mounted on the disc along the $D_x1$ diameter. Thus, the element X1 will detect the vibrations of the frequency $f_1$ along this axis and so supply an electrical output signal proportional to the amplitude of the frequency $f_1$ appearing in the frequency modulated input signal. The frequency $f_2$ may be detected along the $D_y2$ diameter which is an antinodal diameter along which maximum amplitude of vibrations of frequency $f_2$ may be detected. The electrostrictive element X2 is suitably mounted on the surface of the disc along this axis. Therefore, the element X2 will have applied thereto a vibratory force proportional to the amplitude of the frequency $f_2$ appearing in the input frequency modulated signal, and thus is capable of providing an output signal proportional to the amplitude of the frequency $f_2$. The electrostrictive elements may, of course, be mounted on the disc in different quadrants than shown in FIG. 4. For example, the input electrostrictive element XS may be disposed on any of the respective diameters $D_s$–$D_s'$ in any of the quadrants A, B, C or D of the disc. However, for best operation it is probably advisable to place the signal input element XS either in the position shown in the C quadrant or along the $D_s'$ axis in the B quadrant so that there will not be any interference between the input signals applied and output signals generated. The electrostrictive elements are shown mounted on the top of the disc, however, they also may be mounted on the bottom or disposed on both sides of the disc and still operate satisfactorily. The elements may suitably be mounted with an epoxy resin glue to the surface of the resonator disc.

Figures 5A, 5B:
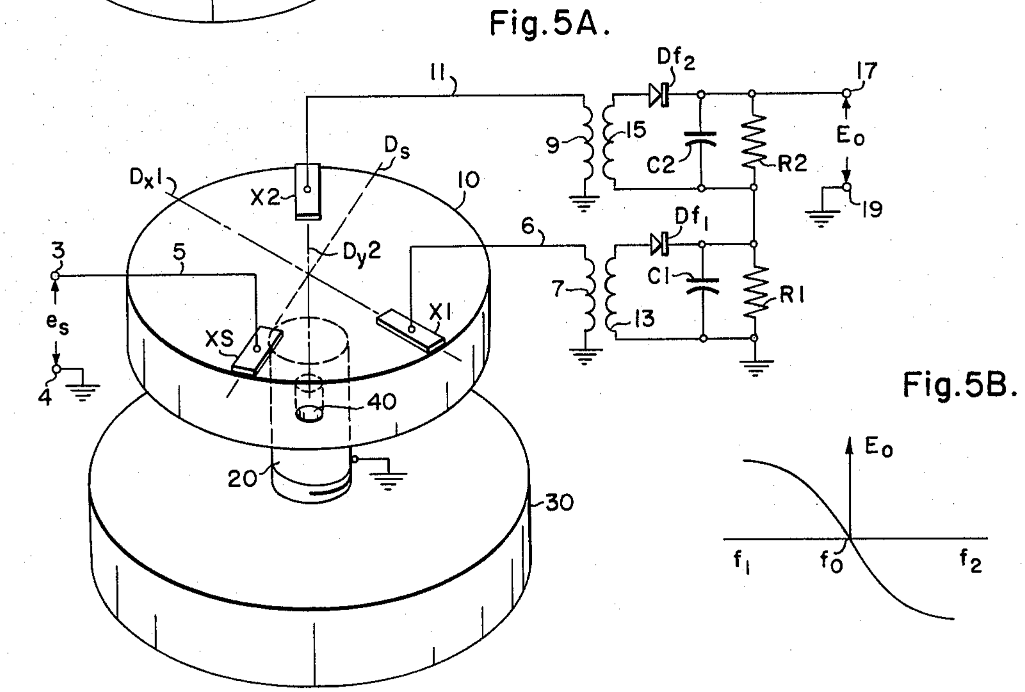
FIG. 5A is an isometric-schematic diagram of the frequency discriminator of the present invention.
FIG. 5B is a plot of the discriminator S curve of FIG. 5A.

Referring now to FIG. 5A, an electromechanical discriminator is shown having a discriminator S curve as plotted in FIG. 5B. The sensing element for the discriminator comprises the resonator having the disc 10, the mounting member 20 and the base member 30. An aperture 40 is provided so that the resonator may vibrate at two predetermined frequencies $f_1$ and $f_2$ about the unperturbed frequency $f_0$ of the disc. An input signal $e_s$ is applied across the terminals 3 and 4. The signal $e_s$ is a frequency modulated signal having an intermediate frequency of $f_0$ and having deviation frequencies of $f_1$ and $f_2$. The input signal $e_s$ is applied through lead 5 to the input electrostrictive element XS which is disposed on the top surface of the disc 10 along the $D_s$ diameter 22½ degrees clockwise from $D_y2$ axis measuring from the hole 40. The input signal thus applies an electrical field across the element XS, with the circuit being completed through the mounting member 20 which is grounded. The electric field causes the element XS to expand and contract applying a force to the disc 10. A vibratory force is directed to the disc 10 activating it into vibration. The output sensing element X1 is mounted along the $D_x1$ diameter 45 degrees counterclockwise measuring from the hole 40 so that it will be responsive to the frequency $f_1$. The electrostrictive element X2 is mounted along the $D_y2$ axis 180° from the hole 40 so that it will be responsive to the frequency $f_2$. Thus, as the disc 10 vibrates the element X1 has applied thereto a mechanical force proportional to the amplitude of frequency $f_1$. The electrostrictive element X1 will then generate an electrical potential proportional to the magnitude of the frequency $f_1$ which may then be taken from the element X1 through lead 6 and applied to the coil 7. Similarly, the element X2 will be activated by a mechanical force proportional to the magnitude of the frequency $f_2$ that appears in the input frequency modulated signal $e_s$. The output element X2 will then provide an electrical signal proportional to the magnitude of the frequency $f_2$ to the coil 9 which is connected to the element X2 through lead 11.

The alternating output signal proportional to the magnitude of the frequency $f_1$ appearing in the primary coil 7 is then induced in the secondary coil 13. This signal is rectified by the diode $Df_1$, which has its anode connected to the coil 13. Any alternating signals appearing in the rectified signals are then shorted to ground through the capacitor C1 which is connected from the anode of the diode $Df_1$ to ground. A unidirectional signal proportional to the amplitude of the frequency $f_1$ thus appears across the resistor R1, which is connected across the capacitor C1.

The alternating signal proportional to the frequency $f_2$ applied to the primary coil 9 from element X2 is induced in the secondary coil 15 and then rectified by the diode $Df_2$, which has its cathode connected to the coil 15. Any alternating components remaining in the rectified signal are shorted to ground through the capacitor C2 which has one end connected to the anode of the diode $Df_2$ and the other end connected to the resistor R1. A unidirectional signal proportional to the amplitude of the frequency $f_2$ appearing in the input signal $e_s$ then appears across the resistor R2, which is connected across the capacitor C2. The voltages across the resistors R2 and R1 are added algebraically between the terminal 17 and ground. Thus, between the terminal 17 and the terminal 19, connected to ground, the output voltage $E_0$ appears as the difference voltage between the amplitudes of the $f_1$ and $f_2$ frequency components of the input signal $e_s$.

The output voltage $E_0$ is shown plotted in FIG. 5B as a function of frequency. It can readily be seen that this is the S curve of a discriminator with the zero level being at frequency $f_0$ and maximum pole outputs being attained at the extreme deviations of the frequency modulated signals at $f_1$ and $f_2$. So by applying a frequency modulated signal having an intermediate frequency $f_0$ and varying between the maximum and minimum frequencies $f_2$ and $f_1$, respectively, an output signal proportional in amplitude to the deviation of the incoming signal $e_s$ from the intermediate frequency $f_0$ is obtained; thus providing the discriminator S curve as desired.

It should be noted that the material of the disc should be of a high Q material such as aluminum so that high sensitivity may be achieved with such a resonator. The unperturbed frequency $f_0$ of the disc may be changed easily by drilling an axial hole through the center O of the disc. By drilling such a hole the frequency $f_0$ is lowered, while not affecting the frequency range between the pole frequencies $f_1$ and $f_2$. See the Whittaker and Thompson application Serial No. 190,118, supra.

Although the present invention has been described with a certain degree of particularity it should be understood that the present disclosure has been made by way of example and that numerous changes in the details of construction and the combination of arrangement of parts and elements may be resorted to without departing from the scope and the spirit of the present invention.

We claim as our invention:

1. A frequency discriminator operative with input signals varying about an intermediate frequency comprising, a mechanical vibrator resonant in a flexural mode having a plurality of nodal and antinodal diameters, said vibrator having a first surface, a second surface opposite said first surface and a side surface between said first and second surfaces, mounting means for providing an undamped connection to said vibrator, a dissymmetry portion on said vibrator, input means including a transducer element to receive said input signals and being operative to actuate said vibrator into vibration, first output means including a transducer element disposed along at least one of said diameters and being responsive to at least one predetermined frequency to provide first output signals proportional to the amplitude of the responsive frequencies, and second output means including a transducer element disposed along at least one other of said diameters and being responsive to at least one other frequency to provide second output signals proportional to the amplitude of the responsive frequency.

2. A frequency discriminator operative with input signals varying about an intermediate frequency comprising, a mechanical vibrator resonant in a flexural mode having a plurality of nodal diameters, said vibrator having a first surface, a second surface opposite said first surface and a side surface between said first and second surfaces, mounting means for providing an undamped connection to said vibrator so that equal and opposite forces cancel between said vibrator and said mounting means, a dissymmetry portion on at least one of said surfaces, input transducer means to receive said input signals and being operative to actuate said vibrator into vibration at predetermined frequencies about said intermediate frequency along predetermined diameters of said vibrator, first output transducer means disposed along at least one of said predetermined diameters and being responsive to at least one of said predetermined frequencies to provide first output signals proportional to the amplitude of the responsive frequencies, and second output transducer means disposed along at least one other of said predetermined diameters and being responsive to at least one other of said predetermined frequencies to provide second output signals proportional to the amplitude of the responsive frequencies.

3. A frequency discriminator operative with input signals varying about an intermediate frequency comprising, a mechanical vibrator resonant in a flexural mode having a plurality of nodal and antinodal diameters, said vibrator having a first surface, a second surface opposite said first surface and a side surface between said first and second surfaces, mounting means for providing an undamped connection to said vibrator so that equal and opposite forces cancel between said vibrator and said mounting means, a dissymmetry portion on at least one of said surfaces, input means including an electrostrictive element to receive said input signals and being operative to actuate said vibrator into vibration at at least two predetermined frequencies about said intermediate frequency along at least two predetermined diameters respectively of said vibrator, first output means including an electrostrictive element disposed along at least one of said antinodal diameters and being responsive to at least one of said predetermined frequencies to provide first output signals proportional to the amplitude of the responsive frequencies, and second output means including an electrostrictive element disposed along at least one other of said antinodal diameters and being responsive to at least one other of said predetermined frequencies to provide second output signals proportional to the amplitude of the responsive frequencies, said input means including an electrostrictive element disposed at a position between the antinodal diameters along which the electrostrictive element of said first and second input means are disposed.

4. A frequency discriminator operative with input signals varying about an intermediate frequency comprising, a disc-shaped mechanical vibrator resonant in a flexural mode having a plurality of nodal and antinodal diameters, said vibrator having a planar top surface, a planar bottom surface opposite and parallel to said top surface and a side surface perpendicular to and between said top and bottom surfaces, mounting means connected to the bottom surface of said vibrator at its center so that equal and opposite forces cancel between said vibrator and said mounting means, an aperture extending inwardly from said side surface, input means including an electrostrictive element to receive said input signals and being operative to actuate said vibrator into vibration at a first frequency along a first diameter and a second frequency along a second diameter, first output means including an electrostrictive element disposed on one of said planar surfaces along one of said antinodal diameters in a plane including said aperture and being responsive to said first frequency to provide first output signals proportional to the amplitude of said first frequency, second output means including an electrostrictive element disposed on one of said planar surfaces along another of said antinodal diameters and being responsive to said second frequency to provide second output signals proportional to the amplitude of said second frequency, said input means including an electrostrictive element disposed on one of said planar surfaces at a position between the antinodal diameters along which the electrostrictive element of said first and second input means are disposed.

References Cited by the Examiner

UNITED STATES PATENTS

| | | | |
|---|---|---|---|
| 2,233,199 | 2/1941 | Donley | 329—142 |
| 2,695,357 | 11/1954 | Donley | 310—8.2 |
| 3,074,034 | 1/1963 | Crownover | 310—9.8 |

FOREIGN PATENTS

| | | |
|---|---|---|
| 387,613 | 1/1924 | Germany. |

ORIS L. RADER, *Primary Examiner.*

ALFRED BRODY, *Examiner.*

PAUL L. GENSLER, ANTHONY J. ROSSI, *Assistant Examiners.*